United States Patent
Denes

(10) Patent No.: US 11,404,625 B2
(45) Date of Patent: Aug. 2, 2022

(54) MULTILAYER ACTUATOR

(71) Applicant: Robert Bosch GmbH, Stuttgart (DE)

(72) Inventor: Istvan Denes, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 1050 days.

(21) Appl. No.: 16/063,358

(22) PCT Filed: Dec. 6, 2016

(86) PCT No.: PCT/EP2016/079838
§ 371 (c)(1),
(2) Date: Jun. 18, 2018

(87) PCT Pub. No.: WO2017/108385
PCT Pub. Date: Jun. 29, 2017

(65) Prior Publication Data
US 2018/0366635 A1    Dec. 20, 2018

(30) Foreign Application Priority Data

Dec. 21, 2015   (DE) .......................... 102015226143.3

(51) Int. Cl.
*H01L 41/047* (2006.01)
*H01L 41/083* (2006.01)
(Continued)

(52) U.S. Cl.
CPC ...... *H01L 41/0472* (2013.01); *H01L 41/0533* (2013.01); *H01L 41/083* (2013.01);
(Continued)

(58) Field of Classification Search
CPC ............... H01L 41/047; H01L 41/0472; H01L 41/0477; H01L 41/083; H01L 41/0986
(Continued)

(56) References Cited

U.S. PATENT DOCUMENTS 6,411,018 B1 *  6/2002  Heinz ................. H01L 41/0472
                                                  310/363
6,784,600 B2 *  8/2004  Klee ..................... B06B 1/0688
                                                  252/62.9 R
(Continued)

FOREIGN PATENT DOCUMENTS

DE    102007058873 A1    6/2009
DE    102008002504 A1    12/2009
(Continued)

OTHER PUBLICATIONS

International Search Report dated Apr. 11, 2017 of the corresponding International Application PCT/EP2016/079838 filed Dec. 6, 2016.

*Primary Examiner* — Derek J Rosenau
(74) *Attorney, Agent, or Firm* — Nortn Rose Fulbright US LLP; Geraard Messina

(57) ABSTRACT

A multilayer actuator includes multiple electrode layers of alternating polarity situated one on top of the other in the direction of a longitudinal axis, and dielectric layers situated between the electrode layers. The electrode layers of identical polarity each extend as far as, and are electrically connected to one another at least indirectly in, an edge area on one side in a direction perpendicular to the longitudinal axis and end before the edge area on the opposite side.

16 Claims, 3 Drawing Sheets

(51) Int. Cl.
*H01L 41/053* (2006.01)
*H01L 41/09* (2006.01)
*H01L 41/193* (2006.01)

(52) U.S. Cl.
CPC ...... *H01L 41/0986* (2013.01); *H01L 41/0477* (2013.01); *H01L 41/193* (2013.01)

(58) Field of Classification Search
USPC ........................................ 310/328, 365, 366
See application file for complete search history.

(56) References Cited

U.S. PATENT DOCUMENTS

| | | | | |
|---|---|---|---|---|
| 6,891,313 | B1* | 5/2005 | Henneken | H01L 41/297 |
| | | | | 310/328 |
| 7,024,737 | B2* | 4/2006 | Schuh | H01M 8/02 |
| | | | | 29/25.35 |
| 7,259,504 | B2* | 8/2007 | Schurz | H01L 41/0472 |
| | | | | 310/328 |
| 2001/0033125 | A1* | 10/2001 | Takao | H01L 41/04 |
| | | | | 310/366 |
| 2013/0328448 | A1* | 12/2013 | Gabl | H01L 41/083 |
| | | | | 310/340 |
| 2014/0009034 | A1* | 1/2014 | Gabl | H01L 41/273 |
| | | | | 310/328 |

FOREIGN PATENT DOCUMENTS

| | | |
|---|---|---|
| DE | 102010062850 A1 | 6/2012 |
| DE | 102014200241 A1 | 7/2015 |

* cited by examiner

MULTILAYER ACTUATOR

CROSS-REFERENCE TO RELATED APPLICATIONS

The present application is the national stage of International Pat. App. No. PCT/EP2016/079838 filed Dec. 6, 2016, and claims priority under 35 U.S.C. § 119 to DE 10 2015 226 143.3, filed in the Federal Republic of Germany on Dec. 21, 2015, the content of each of which are incorporated herein by reference in their entireties.

BACKGROUND

Known from DE 10 2014 200 241 A1 of the applicant is a multilayer actuator for electrically contacting the individual electrode layers to design each electrode layer with two sections of different polarity, which are separated from one another by an insulating section. The insulating section is formed or situated close to a lateral edge area of the electrode layer. This results in electrodes of different sizes relative to the base surface of the electrode layer. Situated between the electrode layers are dielectric layers, which include electrically conducting areas on both sides in lateral edge areas that overlap with the electrodes of the electrode layers. By stacking the electrode layers on top of one another with dielectric layers situated therebetween, each of the electrodes of the individual electrode layers having the same polarity are in electrical contact with one another via electrically conductive areas of the dielectric layers in the area of the opposite edge areas. Such a structure of a multilayer actuator is relatively costly due to the relatively complex design of the individual electrode layers and the dielectric layers.

SUMMARY

An object of the present invention is to refine a multilayer actuator such that the individual electrode layers having the same polarity can be in electrical contact with one another in a simple manufacturing-related manner.

According to example embodiments of the present invention, electrode layers having the same polarity are connected to one another using a connection element situated outside the electrode layers and the dielectric layers and which extends in the longitudinal direction of the multilayer actuator. This allows for a relatively simple structure for both the electrode layers as well as for the dielectric layers. A dielectric layer and an electrode layer, in particular, do not have to be subdivided into different areas.

Since the individual layers of the multilayer actuator, situated flush on top of one another, normally have a rectangular base surface, the sides on which the electrode layers are connected to one another normally also form flat surfaces. In order to enable a preferably simple electrical contacting of the electrode layers in the area of these flat surfaces, the connection element is made of a metal foil, preferably of copper. Copper has the advantage, in particular, that it exhibits a relatively low electrical resistance and therefore minimizes electrical losses and, in addition, can be particularly easily connected to the electrode layers using conventional integral connection technologies.

In an example embodiment, the metal foil has a thickness of less than 50 μm, preferably less than 10 μm. The basis for the relative minimal thickness of the metal foil results from the necessity of the distance between the electrode layers being reduced during an activation of the electrode layers, whereas the electrode layers expand in a direction extending perpendicularly to the longitudinal direction. The reduced distance of the electrode layers relative to one another also causes the distances between the individual contacts of the electrode layers and the connection element to be reduced. Thus, in order not to impede the desired and required reduction of the distances of the electrode layers by the respective connection element, the connection element is relatively flexible in a direction extending in a longitudinal direction which, when using metal, necessarily results in a relatively minimal thickness of such a metal foil.

The connection between the electrode layers and the connection element can be established particularly simply and in a manufacturing-related advantageous manner with integral connections. The technologies being used in this case are a function, in particular, of the exact geometric design and size of the individual layers, of the materials used, as well as of other factors. The integral connection is established preferably in the form of a welded connection, a soldered connection, or an adhesive bond using an electrically conductive adhesive.

In an example embodiment, a gap is formed between the dielectric layers and the connection element. In this way, the connection area between the connection element and the electrode layers, in particular, can be formed or designed free of dielectric, which facilitates, for example, the forming of the individual connections between the connection elements and the electrode layers.

According to an example embodiment of the present invention, a protected arrangement or encapsulation of a multilayer actuator designed in this way is provided, in which the electrical connection elements are situated on its lateral surfaces. For this purpose, in an example embodiment, the electrode layers and the dielectric layers, which are situated flush relative to the electrode layers, are each rectangularly shaped in a plane extending perpendicularly to the longitudinal direction of the multilayer actuator, and at least the corner areas of the electrode layers and of the dielectric layers are covered by angle elements that extend across the multilayer actuator in the longitudinal direction. Such angle elements effectuate an encompassing of the corner areas of the electrode layers as well as the dielectric layers. In an arrangement that includes electrical connection elements situated on two (opposite) side surfaces, it is, in principle, sufficient to provide merely two such angle elements. The two angle elements then cover the side surfaces of the electrode layers and of the dielectric layers on the sides on which no electrical connection elements are situated.

Since, as explained above, the relative distance between the electrode layers, when activated, is reduced as viewed in the longitudinal direction of the multilayer actuator and this reduction of the distances is not to be disrupted by the angle elements situated in the corner areas, it is also advantageous if the angle elements are flexibly designed, as viewed in the longitudinal direction of the multilayer actuator, in such a way that these can be deformed in the longitudinal direction without great effort. For this purpose, it is preferably provided that the angle elements are made of plastic, preferably of a thermoplastic elastomer, and that the angle elements are flexible in the longitudinal direction.

In an example embodiment, in order to also protect the front surfaces situated opposite each other in the longitudinal direction or front surfaces of the multilayer actuator, in addition to the side surfaces of the multilayer actuator, the front faces are each covered by an end cap made preferably of plastic and that is rigid in the longitudinal direction. The end caps can be formed, in particular, of the same material as the aforementioned angle elements, for example. In contrast to the angle elements, however, the end caps are preferably rigid, so that the forces exerted in the axial direction during the deformation or actuation of the multilayer actuator can be transmitted preferably directly, i.e., with no deformation of the end caps. The design of such rigid end caps can be effectuated in a particularly simple manner, for example, by an appropriate choice of wall thickness for the material of the end caps.

The design or construction of the multilayer actuator according to the present invention described thus far is particularly preferred in multilayer actuators, in which these multilayer actuators are constructed using ferroelectric or piezoelectric polymers. Such multilayer actuators are typically distinguished by the fact that when activated, these multilayer actuators exhibit an expansion of 1% and 3% relative to the height of the multilayer actuator in the longitudinal direction.

Additional advantages, features, and details of the present invention result from the following description of preferred exemplary embodiments and with reference to the drawings in which identical elements or elements having identical functions are provided with the same reference numerals.

DETAILED DESCRIPTION

Figure 1:
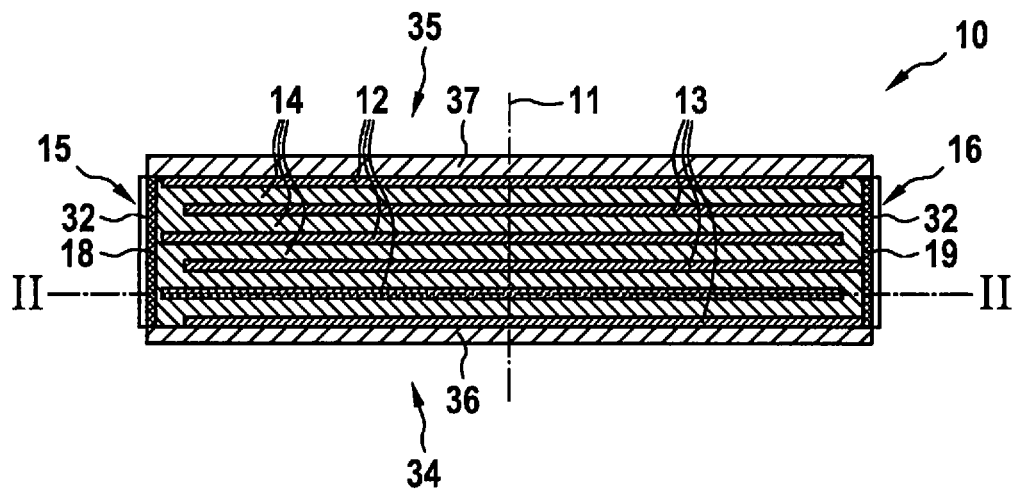
FIG. 1 shows a simplified longitudinal section through a multilayer actuator according to an example embodiment of the present invention.
Figure 2:
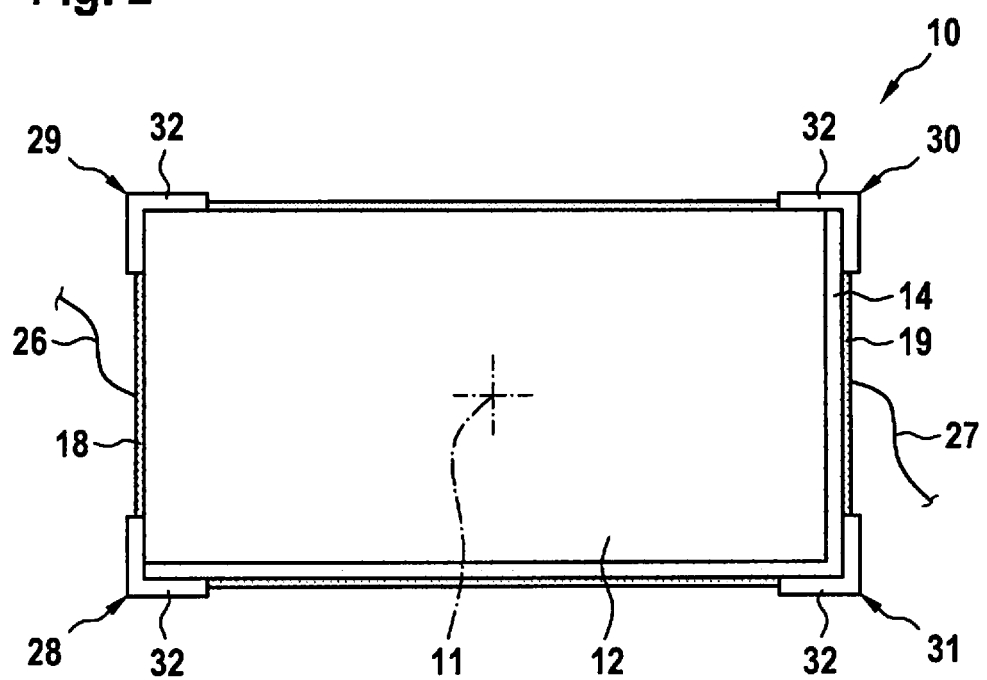
FIG. 2 shows a section in the plane II-II of FIG. 1, according to an example embodiment of the present invention.

Multilayer actuator 10 depicted in FIGS. 1 and 2 is used, in particular, to actuate an element not depicted. Multilayer actuator 10 includes a plurality of electrode layers 12, 13, which are stacked on top of one another relative to a longitudinal axis 11 or longitudinal direction of multilayer actuator 10. Situated between each of electrode layers 12, 13 is a dielectric layer 14.

Electrode layers 12 have a polarity differing from that of electrode layers 13. Electrode layers 12, 13 having an identical polarity, respectively, are each formed on opposite sides extending as far as an edge area 15, 16, which sits flush with at least the lateral boundary of dielectric layer 14, preferably (see FIGS. 3-5), but protrudes laterally beyond dielectric layers 14. In contrast, respective electrode layer 12, 13 on the other side ends in each case before edge area 15, 16.

Electrode layers 12, 13 as well as dielectric layers 14 each have a rectangular base surface, as is most readily apparent in FIG. 2.

Electrode layers 12, 13 of identical polarity formed laterally extending at least to edge areas 15, 16 of dielectric layers 14 are each electrically connected to one another with a connection element 18, 19. Connection element 18, 19 is made preferably of a thin metal foil, preferably of copper, and has a thickness of less than 50 μm, preferably less than 10 μm.

Figure 3:
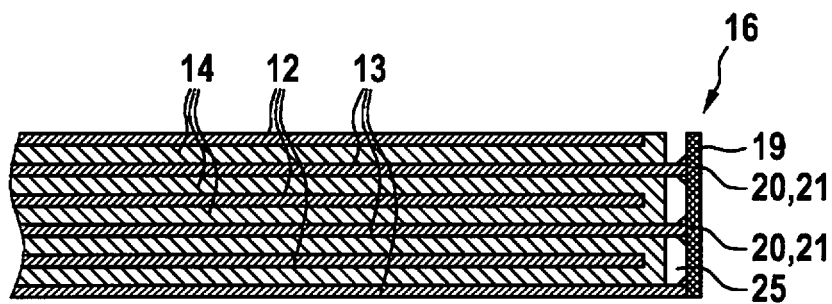
FIGS. 3-5 each shows in partial longitudinal sections, different types of electrical contacting of the electrode layers of equal polarity with a connection element, according to an example embodiment of the present invention.
Figure 4:
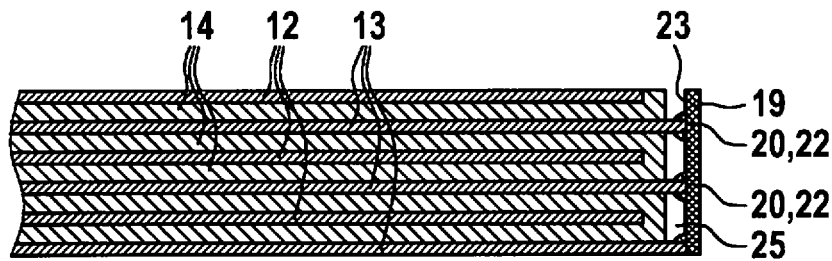
Figure 5:
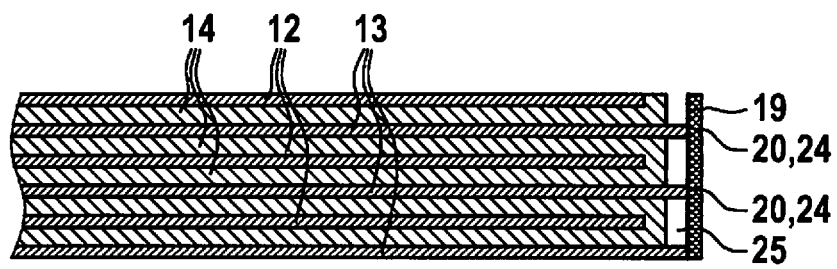

According to the depiction of FIGS. 3-5, the connection between respective electrode layers 12, 13 and connection elements 18, 19 assigned to electrode layers 12, 13 is formed as an integral connection 20. In the exemplary embodiment depicted in FIG. 3, the integral connection 20 is in the form of a welded connection including weld spots 21 between electrode layers 12, 13 and respective connection element 18, 19. In contrast, integral connection 20 in FIG. 4 is formed as a soldered connection, including the formation of soldering points 22. For this purpose, it can be provided that connection element 18, 19 includes a coating 23 on the side facing toward electrode layers 12, 13, in particular, in the form of a tin coating. FIG. 5 depicts the case in which integral connection 20 is formed between electrode layers 12, 13 and connection elements 18, 19 using an adhesive layer 24 made of an electrically conductive adhesive.

Also common to the example embodiments according to FIGS. 3-5 is the formation of a gap 25 between dielectric layers 14 and connection elements 18, 19, except in the areas in which electrode layers 12, 13 are connected to respective connection element 18, 19.

According to the depiction of FIG. 2, connection elements 18, 19 situated on opposite sides, in the exemplary embodiment, on the narrow sides of electrode layers 12, 13 and of dielectric layers 14, are connected to electrical connection lines 26, 27, which in turn are connectable to different poles of a voltage source (not depicted).

It is also apparent in FIG. 2 that individual or all corner areas 28 through 31 of multilayer actuator 10 are protected with or covered by angle elements 32 extending in the direction of longitudinal axis 11. Angle elements 32 are formed as rectangularly folded angle elements 32 and are made of a plastic, preferably of a thermoplastic elastomer. They are formed in such a way or have a thickness such that, even with a slight application of force, they become deformed in the direction of longitudinal axis 11, which normally occurs, for example, when a voltage is applied to electrode layers 12, 13 and is accompanied by a reduction in the distance between electrode layers 12, 13.

In addition, the two front faces 34, 35 of multilayer actuator 10 located opposite each other, as viewed in the direction of longitudinal axis 11, are completely covered with the aid of end caps 36, 37, preferably also made of plastic. End caps 36, 37 can be made, in particular, of the same plastic or material as angle elements 32. However, an appropriate thickness of end caps 36, 37 ensures that these are relatively rigid, i.e., do not become deformed in the direction of longitudinal axis 11.

Figure 6:
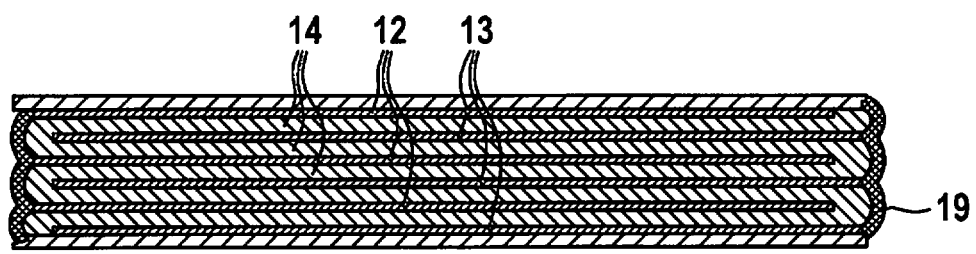
FIG. 6 shows the multilayer actuator according to FIG. 1 in an activated state in which the distances between the individual electrode layers are reduced, according to an example embodiment of the present invention.

Whereas FIG. 1 shows multilayer actuator 10 in a non-activated state, i.e., where no voltage is present on electrode layers 12, 13, FIG. 6 shows multilayer actuator 10 in the activated state. In this state, the distance between individual electrode layers 12, 13 is reduced, i.e., height H in activated multilayer actuator 10 is less than height H of non-activated multilayer actuator 10 according to FIG. 1. It is further apparent that, to compensate for the reduced height of multilayer actuator 10, dielectric layers 14, in particular, expand in a plane extending perpendicularly to longitudinal axis 11. The result of the axial shortening of multilayer actuator 10 is that connection elements 18, 19 also become shortened, as viewed in the direction of longitudinal axis 11, in such a way that these connection elements are bulged outwardly, for example.

Multilayer actuator 10 thus far described can be adapted or modified in various ways, without departing from the inventive concept.

What is claimed is:

1. A multilayer actuator comprising:
   a plurality of electrode layers arranged on top of one another in a direction of a longitudinal axis and being of alternative polarity, so that a first subset of the electrode layers is at a first polarity and a second subset of the electrode layers is at a second polarity;
   a plurality of dielectric layers that are each arranged between respective ones of the electrode layers in the direction of the longitudinal axis;
   a first electrical connection extending parallel to the longitudinal axis at a first edge area that is at a first side of the multilayer actuator; and
   a second electrical connection extending parallel to the longitudinal axis at a second edge area that is at a second side of the multilayer actuator, opposite the first side;
   wherein:
   each of the electrode layers of the first subset extends in a direction perpendicular to the longitudinal axis, reaching and contacting the first electrical connection that is at the first edge area and not reaching and not contacting the second electrical connection that is at the second edge area, and is electrically connected to all others of the first subset by the first electrical connection;
   each of the electrode layers of the second subset extends in the direction perpendicular to the longitudinal axis, reaching and contacting the second electrical connection that is at the second edge area and not reaching and not contacting the first electrical connection that is at the first edge area, and is electrically connected to all others of the second subset by the second electrical connection;
   each of the plurality of dielectric layers extends in the direction perpendicular to the longitudinal axis towards, but not reaching and not contacting, the first and second electrical connections, so that:
      at the first electrical connection at the first edge area, immediately adjacent ones of the first subset of the electrode layers are exposed to each other without being separated from each other by any of the dielectric layers in the direction of the longitudinal axis;
      at the second electrical connection at the second edge area, immediately adjacent ones of the second subset of the electrode layers are exposed to each other without being separated from each other by any of the dielectric layers in the direction of the longitudinal axis; and
      in a center region between the first and second edge areas, each pair of immediately adjacent ones of the electrode layers is separated from each other, in the direction of the longitudinal axis, by a respective one of the dielectric layers;
   the multilayer actuator is constructed so that a height of the multilayer actuator changes between an activated state present when voltage is applied to the electrode layers and a non-activated state present when the voltage is not applied to the electrode layers; and
   either or both of the following features (a) and (b):
      (a) (1) the multilayer actuator further comprises a respective plastic angled cover that extends in the direction of the longitudinal axis to thereby cover the plurality of electrode layers at at least one respective corner of the multilayer actuator, and that is flexible in the direction of the longitudinal axis so that its size, in the direction of the longitudinal axis, changes between the activated state and the non-activated state, (2) the multilayer actuator further comprises a first plastic end cap extending, over a top-most one of the electrode layers, in the direction perpendicular to the longitudinal axis and a second plastic end cap extending, below a bottom-most one of the electrode layers, in the direction perpendicular to the longitudinal axis, and (3) each of the first and second end caps is rigid in the direction of the longitudinal axis so that its size, in the direction of the longitudinal axis, does not change between the activated state and the non-activated state; and
      (b) due to the height of the multiplayer actuator changing between the activated state and the non-activated state: (1) in one of the states, the extension of the first and second electrical connections is straight, and (2) in the other of the states, the extension of the first electrical connection forms a plurality of curved regions that is each bounded by a respective pair of adjacent ones of the first subset of the electrode layers, and the extension of the second electrical connection forms a plurality of curved regions that is each bounded by a respective pair of adjacent ones of the second subset of the electrode layers.

2. The multilayer actuator of claim 1, wherein the electrical connections are each made of a copper foil.

3. The multilayer actuator of claim 1, wherein the electrical connections are each made of a metal foil.

4. The multilayer actuator of claim 3, wherein the metal foil has a thickness of less than 50 µm.

5. The multilayer actuator of claim 3, wherein the metal foil has a thickness of less than 10 µm.

6. The multilayer actuator of claim 1, wherein the electrode layers of the first subset are integrally connected to the first electrical connection and the electrode layers of the second subset are integrally connected to the second electrical connection.

7. The multilayer actuator of claim 6, wherein the integral connections are formed as welded connections, soldered connections, or adhesive bonds using an electrically conductive adhesive.

8. The multilayer actuator of claim 1, wherein the electrode layers and the dielectric layers are each rectangular in a plane extending perpendicularly to the longitudinal axis, and at least corner areas of the electrode layers and of the dielectric layers are covered by angle elements that extend in the direction of the longitudinal axis.

9. The multilayer actuator of claim 8, wherein the angle elements are made of plastic and are flexible in the direction of the longitudinal axis.

10. The multilayer actuator of claim 8, wherein the angle elements are made of a thermoplastic elastomer and are flexible in the direction of the longitudinal axis.

11. The multilayer actuator of claim 1, wherein two end faces of the multilayer actuator located opposite each other in the direction of the longitudinal axis are each covered by respective end caps that are rigid in the direction of the longitudinal axis.

12. The multilayer actuator of claim 11, wherein the end caps are made of plastic.

13. The multilayer actuator of claim 11, wherein the end caps are made of a thermoplastic elastomer.

14. The multilayer actuator of claim 1, wherein the multilayer actuator is constructed using at least one of ferroelectric polymers and piezoelectric polymers, and the actuator is configured to expand in the longitudinal direction between 1% and 3% of a height of the multilayer actuator.

15. The multilayer actuator of claim 1, wherein:
the multilayer actuator further comprises the respective plastic angled cover that extends in the direction of the longitudinal axis to thereby cover the plurality of electrode layers at the at least one respective corner of the multilayer actuator, and that is flexible in the direction of the longitudinal axis so that its size, in the direction of the longitudinal axis, changes between the activated state and the non-activated state;
the multilayer actuator further comprises the first plastic end cap extending, over the top-most one of the electrode layers, in the direction perpendicular to the longitudinal axis and the second plastic end cap extending, below the bottom-most one of the electrode layers, in the direction perpendicular to the longitudinal axis; and
each of the first and second end caps is rigid in the direction of the longitudinal axis so that its size, in the direction of the longitudinal axis, does not change between the activated state and the non-activated state.

16. The multilayer actuator of claim 1, wherein, due to the height of the multilayer actuator changing between the activated state and the non-activated state, in one of the states, the extension of the first and second electrical connections is straight and, in the other of the states:
the extension of the first electrical connection forms the plurality of curved regions that is each bounded by the respective pair of adjacent ones of the first subset of the electrode layers; and
the extension of the second electrical connection forms the plurality of curved regions that is each bounded by the respective pair of adjacent ones of the second subset of the electrode layers.

* * * * *